(12) United States Patent
Estacio et al.

(10) Patent No.: US 6,646,329 B2
(45) Date of Patent: Nov. 11, 2003

(54) POWER CHIP SCALE PACKAGE

(75) Inventors: Maria Cristina B. Estacio, Cebu (PH); Ruben Madrid, Cebu (PH)

(73) Assignee: Fairchild Semiconductor, Inc., South Portland, ME (US)

( * ) Notice: Subject to any disclaimer, the term of this patent is extended or adjusted under 35 U.S.C. 154(b) by 0 days.

(21) Appl. No.: 09/858,811

(22) Filed: May 15, 2001

(65) Prior Publication Data

US 2002/0171126 A1 Nov. 21, 2002

(51) Int. Cl.[7] .............................................. H01L 29/72
(52) U.S. Cl. ....................... 257/666; 257/670; 257/671; 257/782
(58) Field of Search ................................ 257/666, 670, 257/671, 782

(56) References Cited

U.S. PATENT DOCUMENTS 4,783,428 A * 11/1988 Kalfus ........................ 257/666
4,878,108 A * 10/1989 Phelps et al. ............... 257/667
6,006,981 A * 12/1999 Madrid ....................... 257/345

* cited by examiner

*Primary Examiner*—Edward Wojciechowicz
(74) *Attorney, Agent, or Firm*—Townsend and Townsend and Crew

(57) ABSTRACT

A packaging arrangement for a semiconductor device including a leadframe and a die coupled thereto. The die is coupled to the leadframe such that its back surface (drain area) is coplanar with source leads and a gate lead extending from the leadframe. A stiffener is coupled to the leadframe and electrically isolated therefrom in order to help maintain the position of the source and gate pads of the leadframe. When the semiconductor device is coupled to a printed circuit board (PCB), the exposed surface of the die serves as the direct drain connections while the source leads and gate leads serve as the connections for the source and gate regions of the die.

8 Claims, 3 Drawing Sheets

POWER CHIP SCALE PACKAGE

BACKGROUND OF THE INVENTION

1. Field of the Invention

The present invention relates to a package for a semiconductor device, and more particularly, to a package for a MOSFET device in a chip scale package that provides superior thermal performance and very low package resistance, as well as methods of manufacturing thereof.

2. Description of the Prior Art

Semiconductor devices, especially MOSFET devices, generally desire very low package resistance (RDSon) with good thermal performance. It is also generally desirable to have the package as small as possible with reference to the die. Thus, numerous packaging concepts and methods have been developed in the prior art.

SUMMARY OF THE INVENTION

The present invention provides a semiconductor device that includes a lead frame including a source pad, at least two source lead rails at a periphery of the source pad, a gate pad adjacent to the source pad, and a gate lead rail at a periphery of the gate pad. A die is coupled to the source pad and the gate pads such that a surface of the die opposite the pads is substantially flush or co-planar with the ends of the lead rails. A stiffener is coupled to the lead frame and electrically isolated therefrom.

In accordance with one aspect of the present invention, the stiffener comprises a copper slug.

In accordance with another aspect of the present invention, the stiffener is coupled to the lead frame with polyamide tape that provides the electrical isolation.

In accordance with a further aspect of the present invention, the lead frame includes at least three source lead rails.

Thus, the present invention provides a chip scale package for semiconductor devices that has very low package resistance (RDSon) and superior thermal performance. The package may not fully conform to the chip scale size definition since its package size is 1.65 times its chip size, but this ratio is one of the most aggressive for MOSFET Power devices.

Other features and advantages of the present invention will be understood upon reading and understanding the detailed description of the preferred exemplary embodiments found herein below, in conjunction with reference to the drawings, in which like numerals represent like elements.

DESCRIPTION OF THE PREFERRED EXEMPLARY EMBODIMENTS

Figure 4:
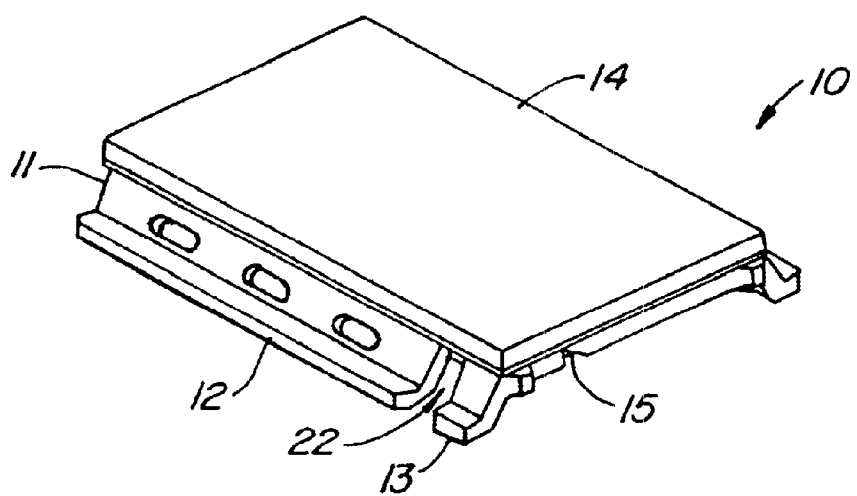
FIG. 4 is a top perspective view of the packaging arrangement illustrated in FIG. 1.

FIG. 4 illustrates a package 10 for a semiconductor device. The package includes a leadframe 11 that includes source leads 12 and a gate lead 13. Preferably, the package includes a stiffener 14 that is electrically isolated from the leads. Preferably, an adhesive or tape 15 is used to electrically isolate the stiffener. In a preferred embodiment, the tape comprises a polyamide tape.

Figure 1:
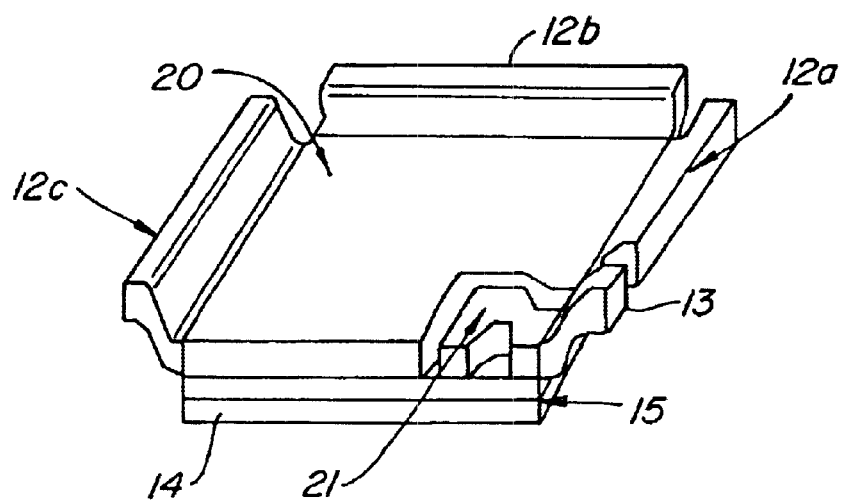
FIG. 1 is a bottom perspective view of a packaging arrangement for a MOSFET device in accordance with the present invention.
Figure 3:
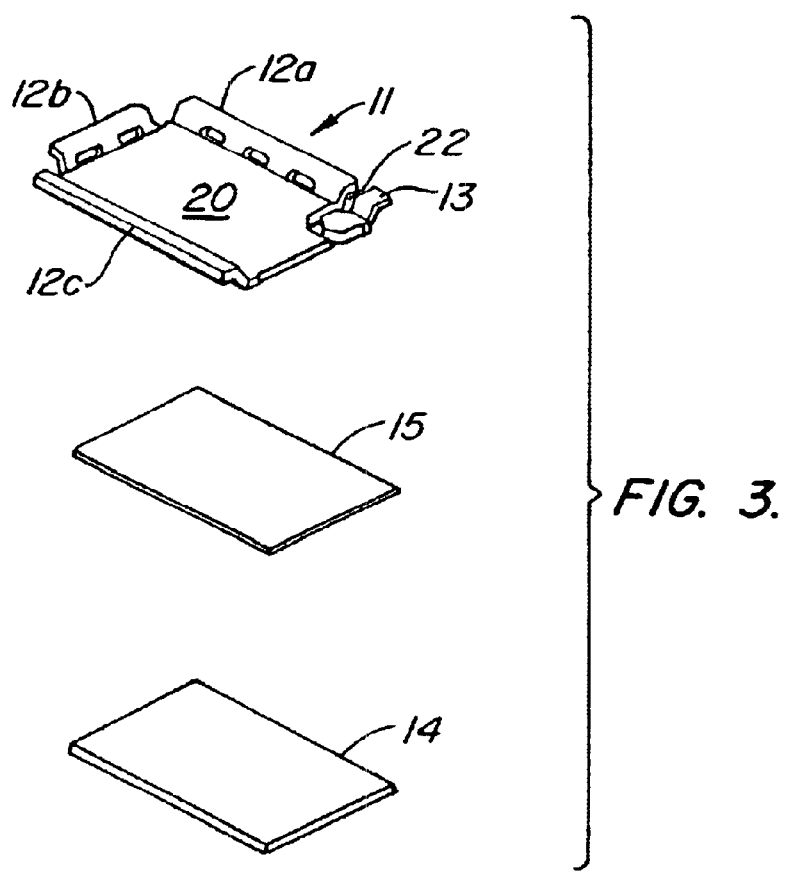
FIG. 3 is an exploded view of the packaging arrangement illustrated in FIG. 1.

As can be seen in FIGS. 1 and 3, the leadframe comprises a source pad 20 and a gate pad 21. Preferably, the source pad includes at least three source lead rails 12a, b, c coupled thereto at a periphery of the source pad. There may be four source leads but preferably there are only three to allow for easier drain contact routing to the board. The gate pad is preferably adjacent to the source pad and electrically isolated therefrom, preferably by gap 22. The gate pad includes a gate lead extending from a periphery of the gate pad.

The stiffener helps retain the gate lead in a rigid position. Preferably, the stiffener comprises a copper slug. The stiffener is coupled to the leadframe with an adhesive or tape (nonconductive tape) layer 15 to electrically isolate the stiffener from the leadframe. As noted above, in a preferred embodiment, layer 15 comprises a polyimide tape. While the stiffener is illustrated as being substantially the same size as the source pad and the gate pad combined, those skilled in the art will understand that the stiffener may be of various shapes and sizes as long as it is shaped and sized to accordingly act as a stiffener to hold the gate pad and the gate lead on the lower right edge of the leadframe since it is desirable to maintain the gate lead in alignment with the adjacent source leads.

Figure 5:
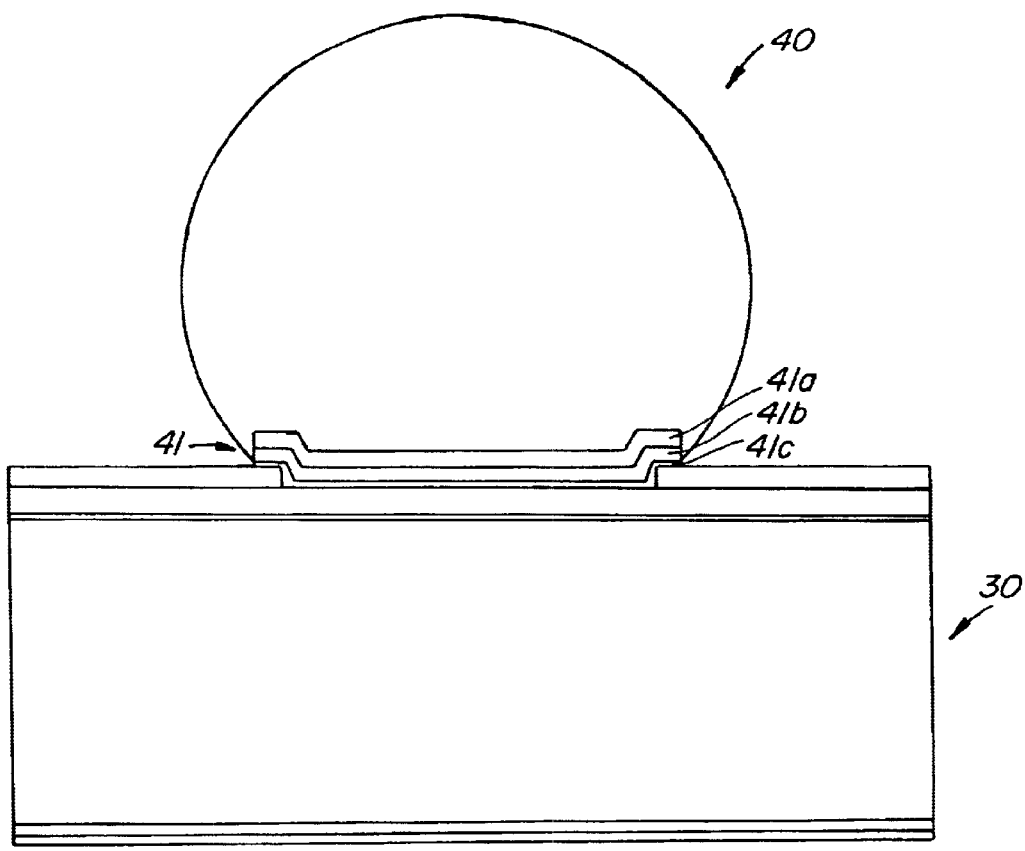
FIG. 5 is a side sectional view of a bumped die.

As can be seen in FIG. 1, a die 30 is flip chip attached onto the source and gate pads. The flip chip attachment is preferably performed with solder bumps and hence, preferably the die is what is referred to in the art as a bumped die. Bumped dies are generally one-piece items. As can be seen in FIG. 5, a bumped die includes the die, solder bumps 40, an "under bump" material 41 that serves as an intermediate layer between the top surface of the die. Preferably, the under bump material is one of TiW, Cu, Au or an equivalent. In the example illustrated in FIG. 5, the under bump material is broken into three layers—Cu plating 41a, sputtered Cu 41b, and sputtered Ti 41c.

The die is placed on the source and gate pads such that exposed surface 51 of the die is coplanar with the source and gate leads. Hence, when the semiconductor device is placed on a printed circuit board (PCB), the exposed, coplanar surface of the die serves as the direct drain connection while the source leads serve as the source connections and the gate lead serves as the gate connection.

Figure 2:
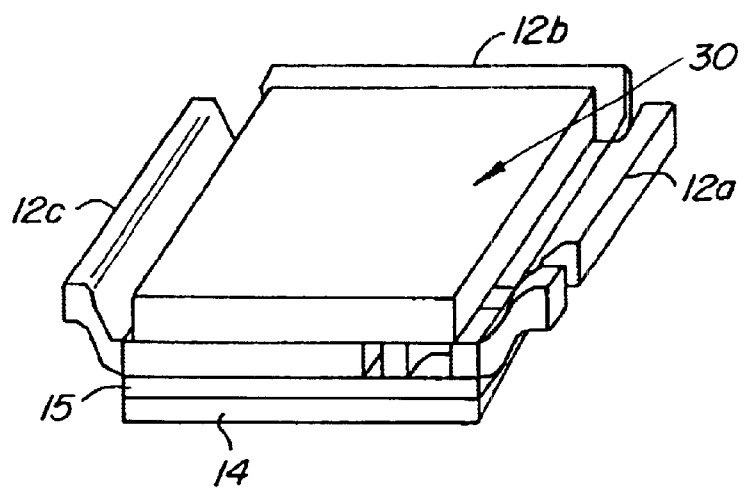
FIG. 2 is a bottom perspective view of the packaging arrangement illustrated in FIG. 1 with a die attached thereto.

Preferably, the lead frame comprises a copper frame. As can be seen in FIG. 2, the leads are preferably preformed and holes are provided to facilitate forming of the leads.

Manufacturing or packaging of the semiconductor device may be performed in a variety of ways. Generally, a die is provided (usually by sawing a wafer) and flip chip attaching the die to the leadframe. As noted above, preferably the die is a bumped die. If not, solder needs to be provided for the die. The flip chip attach procedure includes reflowing of the solder between the die and the leadframe singulation to individual units is then performed, preferably by laser. The semiconductor device is then electrically tested. Upon completion of the testing, the semiconductor device is placed on a tape and reel with other semiconductor devices for supplying to a customer.

In accordance with another manufacturing procedure, the gate lead can be isolated from the matrix copper strip upon receipt of the frame or after flip chip attach. This will enable manufacturing to test in strip form.

In accordance with another manufacturing procedure, an encapsulant application to enhance rigidity and curing is performed between the flip chip attach and the laser cut. The semiconductor device may be automatically tested and placed on the tape and reel or, a gate isolation and strip testing may be performed prior to the laser cut, and then the semiconductor device placed on the tape and reel.

Thus, the present invention provides a package the meets very low package resistance (RDSon) for semiconductor devices, especially MOSFET devices, in a chip scale package with superior thermal performance. The packaging concept in accordance with the present invention conforms to a chip scale definition whose package size is 1.8 times its chip size. The leadframe is designed such that the bumped die is flip chip attached such that the die backside (drain) is coplanar with the extended preformed source and gate leads. Thus, during board mounting, the die backside is soldered directly to the PCB as a drain connection while the source and gate leads are simultaneously soldered with it as per their designated locations. The final package structure makes use of a stiffener as added support to the source and gate leads with a non-conductive tape in between the leadframe and the stiffener in order to electrically isolate the connection of the gate and source leads.

Although the invention has been described with reference to specific exemplary embodiments, it will be appreciated that it is intended to cover all modifications and equivalents within the scope of the appended claims.

What is claimed is:

1. A semiconductor device comprising:
   a. a leadframe comprising:
      i. a source pad;
      ii. at least two source lead rails at a periphery of the source pad;
      iii. a gate pad adjacent the source pad and electrically isolated therefrom; and
      iv. gate lead rail at a periphery of the gate pad;
   b. a die coupled to the source pad and the gate pad; and
   c. a stiffener coupled to the leadframe and electrically isolated therefrom.

2. A semiconductor device in accordance with claim 1 wherein the stiffener comprises a copper slug.

3. A semiconductor in accordance with claim 1 wherein the stiffener is coupled to the leadframe with polyimide tape that provides the electrical isolation.

4. A semiconductor device in accordance with claim 2 wherein the stiffener comprises a copper slug.

5. A semiconductor device in accordance with claim 4 comprising at least three source lead rails.

6. A semiconductor device comprising:
   a. a leadframe including a top and a bottom surface and gate and source leads;
   b. a die coupled to the bottom surface such that a surface of the die is coplanar with the gate and source leads; and
   c. a stiffener coupled to the top surface and electrically isolated therefrom.

7. A semiconductor device in accordance with claim 6 wherein the stiffener is coupled to the leadframe with polyamide tape that provides the electrical isolation.

8. A semiconductor device in accordance with claim 6 wherein the stiffener comprises a copper slug.

* * * * *

UNITED STATES PATENT AND TRADEMARK OFFICE
CERTIFICATE OF CORRECTION

PATENT NO. : 6,646,329 B2
DATED : November 11, 2003
INVENTOR(S) : Maria Cristina B. Estacio et al.

It is certified that error appears in the above-identified patent and that said Letters Patent is hereby corrected as shown below:

Column 4,
Line 11, after "semiconductor" insert -- device --.

Signed and Sealed this

Sixteenth Day of March, 2004

JON W. DUDAS
*Acting Director of the United States Patent and Trademark Office*